United States Patent [19]

Camberlin et al.

[11] Patent Number: 5,053,474

[45] Date of Patent: Oct. 1, 1991

[54] IMIDO POLYMERS

[75] Inventors: Yves Camberlin, Caluire; Philippe Michaud, Villeubanne, both of France

[73] Assignee: Rhone-Poulenc Chimie, Courbevoie, France

[21] Appl. No.: 426,850

[22] Filed: Oct. 26, 1989

[30] Foreign Application Priority Data

Oct. 26, 1988 [FR] France ................. 88/14375

[51] Int. Cl.$^5$ .............. C08G 59/40; C08G 65/14; C08G 73/10; C08G 75/00
[52] U.S. Cl. .................. 528/87; 528/117; 528/172; 528/322
[58] Field of Search .......... 528/322, 117, 172, 87

[56] References Cited

U.S. PATENT DOCUMENTS

| | | | |
|---|---|---|---|
| 4,689,378 | 8/1987 | Chaudhari et al. | 528/322 |
| 4,705,833 | 11/1987 | Saito et al. | 528/322 |
| 4,839,440 | 6/1989 | Barthelemy | 528/322 |

FOREIGN PATENT DOCUMENTS 0274968 7/1988 European Pat. Off. .

*Primary Examiner*—John Kight, III
*Assistant Examiner*—Kathryne E. Shelborne
*Attorney, Agent, or Firm*—Burns, Doane, Swecker & Mathis

[57] ABSTRACT

Novel thermally stable imido polymers, whether in prepolymeric or cured state, well adapted for the production of prepregs and other useful shaped articles, include the copolymerizates of:

(a) at least one maleic N,N'-bisimide;
(b) at least one hindered diprimary diamine of the 4,4'-diamino-3,3',5,5'-tetraalkyldiphenylmethane or 1,3-or 1,4-diaminotrialkylbenzene type;
(c) optionally, at least one comonomer other than a bisimide and containing one or more polymerizable carbon-carbon double bonds;
(d) optionally, an imidazole compound; and
(e) at least one chlorinated or brominated epoxy resin, N,N'-alkylenebistetrahalophthalimide and/or a compound containing two phenyl radicals bonded directly together via a single valence bond, a divalent radical or a bridging atom, in which each phenyl radical is substituted by a (meth)allyloxy radical and by at least two chlorine or bromine atoms.

17 Claims, No Drawings

IMIDO POLYMERS

BACKGROUND OF THE INVENTION

1. Field of the Invention

The present invention relates to novel imido polymers, and, more especially, to novel imido polymers comprising the copolymerizates of at least one N,N'-bisimide, at least one hindered diprimary diamine, and at least one chlorinated/brominated epoxy resin, N,N'-alkylenebistetrahalophthalimide and/or (meth)allyloxylated aromatic comonomer bearing at least two chlorine or bromine substituents.

2. Description of the Prior Art

French Patent Application FR-A-2,608,613 describes polymers containing imide groups, which can be in the form of heat-curable prepolymers, which comprise the product of reaction, at a temperature ranging from 50° C. to 300° C., between:

(a) one or more N,N'-bisimides having the formula:

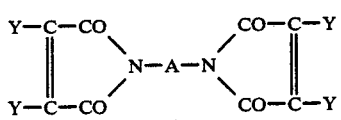

in which the symbols Y, which may be identical or different, are each H, CH$_3$ or Cl; the symbol A is a divalent radical selected from among cyclohexylene, a phenylene, 4-methyl1,3-phenylene, 2-methyl1,3-phenylene, 5-methyl1,3-phenylene, 2,5-diethyl-3-methyl1,4-phenylene, or a radical of the formula:

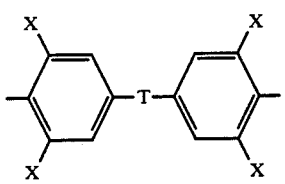

in which T is a single valence bond or one of the groups:

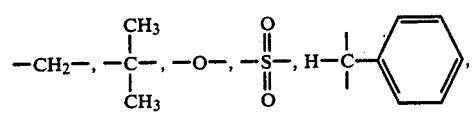

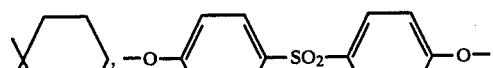

and the symbols X, which may be identical or different, are each a hydrogen atom or a methyl, ethyl or isopropyl radical;

(b) one or more hindered diprimary diamine(s) selected from among:

(i) compounds having the general formula:

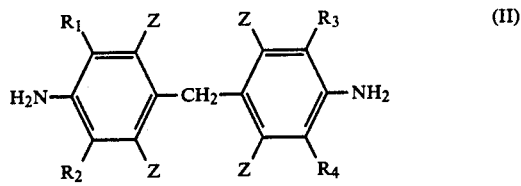

in which the symbols R$_1$, R$_2$, R$_3$ and R$_4$, which may be identical or different, are each a methyl, ethyl, propyl or isopropyl radical; the symbols Z, which may be identical or different, are each a hydrogen atom or a chlorine atom; and (ii) compounds having the general formula:

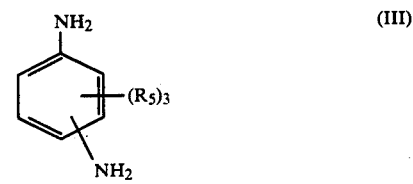

in which the amino radicals are in a meta or para position relative to each other; and the symbols R$_5$, which may be identical or different, are each a methyl, ethyl, propyl or isopropyl radical;

(c) optionally, one or more nonhalogenated monomer(s) other than a bisimide of formula (I) and containing one or more polymerizable carbon-carbon double bond(s); and, optionally (d) an imidazole compound A first advantage associated with the polymerization described in the aforesaid French application stems from the steric hindrance of the amine reactant (b), which is responsible for a lower reactivity of the constituents of the polymerization mixture, vis-a-vis the polyamino bismaleimides produced from unhindered diamines. This lower reactivity of the constituents of the polymerization mixture is of particular interest, not only for the manufacture of articles depending on a conversion of a prepolymer in the molten state, but also for the production of articles depending on a conversion of a prepolymer in the form of a solution in a solvent. Indeed, the viscosity of the prepolymer in the molten state, or that of the prepolymer solution, changes more slightly and this makes the conversion of the prepolymer much easier, especially in applications requiring a working life of several hours.

A second advantage of the polymerization described in the aforesaid French application resides in the fact that the polymers are prepared without taking special precautions from the standpoint of health and hygiene, given that the hindered diamines (b) do not present the toxicity hazards which are generally associated with unhindered aromatic diprimary diamines.

SUMMARY OF THE INVENTION

It has now unexpectedly been found that particular desirable properties can be introduced into the polymers described in the '613 French application by including in the starting material monomer admixture at least one compound selected from among a chlorinated or brominated epoxy resin, an N,N'-alkylenebistetrahalophthalimide, and/or a compound containing two phenyl radicals directly bonded to each other via a single valence bond, or a divalent radical or atom, in which each phenyl radical is substituted by a (meth)allyloxy radical and by at least two chlorine or bromine atoms. Polymerization of such admixture produces polymers having, in particular, an excellent resistance to combustion and a low coefficient thermal expansion.

Thus, the present invention features imido polymers comprising the polymerizates, at a temperature ranging from 50° C. to 300° C., of:

(a) one or more N,N'-bisimides having the above formula (I) and corresponding definitions of Y and A;

(b) one or more hindered diamines having the above formulae (II) and (III) and corresponding definitions of Z, $R_1$, $R_2$, $R_3$, $R_4$ and $R_5$; optionally, (c) one or more nonhalogenated monomers other than a bisimide of formula (I) and containing one or more polymerizable carbon-carbon double bonds; also optionally, (d) an imidazole compound; and (e) an additive comprising at least one compound selected from among:

(e1) a chlorinated or brominated epoxy resin;

(e2) an N,N'-alkylenebistetrahalophthalimide of the formula:

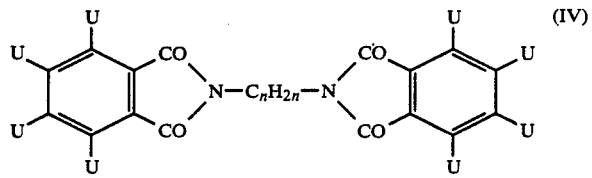

in which the symbols U, which may be identical or different, are each a chlorine or bromine atom; the alkylene radical —$C_nH_{2n}$— is linear or branched; and n is an integer equal to 1, 2, 3 or 4; and (e3) a halogenated compound of the formula:

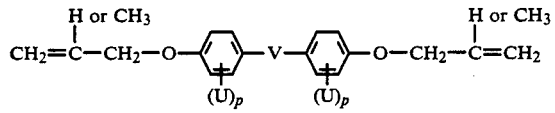

in which the symbols U are as defined above; the symbol V is a single valence bond, a linear or branched —$C_nH_{2n}$— alkylene radical, with n being equal to 1, 2, 3 or 4, or an oxygen atom; and p is an integer equal to 2, 3 or 4.

DETAILED DESCRIPTION OF THE PREFERRED EMBODIMENTS OF THE INVENTION

More particularly according to the present invention, the chlorinated or brominated epoxy resin (e1) is I0 an epoxy resin which has an epoxy equivalent weight ranging from 200 to 2,000 and which comprises a glycidyl ether prepared by reacting epichlorohydrin with a polyphenol that is chlorinated or brominated on the aromatic nucleus or nuclei thereof, said polyphenol being selected from among a bis(hydroxyphenyl)alkane such as 2,2-bis(4-hydroxyphenyl)propane, bis(4-hydroxyphenyl)methane, bis(4-hydroxyphenyl)methylphenylmethane, bis(4-hydroxyphenyl)tolylmethanes, resorcinol, hydroquinone, pyrocatechol, 4,4'-dihydroxydiphenyl, and the products of condensation of the above phenols with an aldehyde.

By the expression "epoxy equivalent weight" is intended the weight of resin (in grams) containing one epoxy functional group

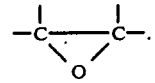

An epoxy resin which has an epoxy equivalent weight of between 250 and 500 is preferably employed. As regards the physical characteristics of such resin, these range from those of the liquid resins of low viscosity (approximately $2 \times 10^{-3}$ Pa.s at 25° C.) up to those of pasty resins whose melting point is on the order of 60° C.

In a preferred embodiment of the invention, an epoxy resin (e1) is used that is a resin comprising glycidyl ether of bis(hydroxyphenyl)alkanes brominated on the aromatic nuclei, more fully discussed hereinbefore in connection with the detailed description of the resin (e1).

By "chlorinated or brominated epoxy resin (e1)" are intended mixtures of a chlorinated or brominated epoxy resin of the above type with an epoxy resin of the same kind, but unhalogenated, which has an epoxy equivalent weight ranging from 100 to 1,000 and which comprises a glycidyl ether obtained by reacting with epichlorohydrin a polyphenol which is unchlorinated or unbrominated on the aromatic nucleus or nuclei and selected from among those phenols discussed above. When such mixtures are employed, an unhalogenated epoxy resin which has an epoxy equivalent weight of from 150 to 300 is preferably selected; most preferably, an unhalogenated epoxy resin is selected that is a resin comprising a glycidyl ether of bis(hydroxyphenyl)alkanes which are unhalogenated on the aromatic nuclei, as described above.

With regard to the compound (e2) of formula (IV), an N,N'-alkylenebistetrabromophthalimide is preferably selected. N,N'-Ethylenebistetrabromophthalimide is more preferably employed according to the present invention.

With regard to the compound (e3) of formula (V), a bis(allyloxydibromophenyl)alkane of formula:

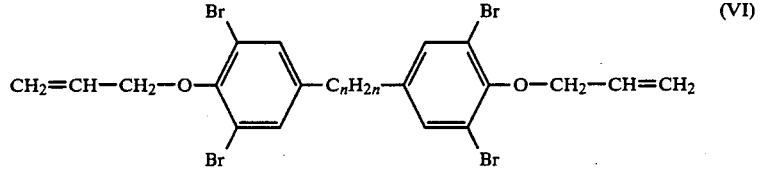

in which n is an integer equal to 1, 2 or 3, is preferably selected. 2,2-Bis(4-allyloxy-3,5-dibromophenyl)propane is more preferably employed per the present invention.

The amount of the additive (e) constitutes 2% to 30%, and preferably 3% to 15%, of the weight of the mixture of bisimide(s) (a) and diamine(s) (b)+optionally reactant (c).

It has now been found that the amount of chlorine or bromine contributed to the polymers according to the invention by the additive (e) is liable to affect certain properties of the final product cured polymers, especially the properties related to thermal stability and those related to the adhesiveness of the polymers to metals such as, for example, copper. The best results are obtained when this amount of chlorine or bromine, contributed by the additive (e), expressed as the weight percentage of elemental chlorine or of elemental bromine relative to the weight of the overall mixture of bisimide(s) (a)+diamine(s) (b)+optional reactant (c)+additive (e), represents not more than 6%; this amount of chlorine or of bromine preferably ranges from 1% to 5%. The amount of chlorine or bromine can be easily adjusted to the desired value by using, for example, epoxy resins (e1) which have a higher or lower chlorine or bromine content and/or by starting with mixtures of chlorinated or brominated epoxy resins (e1) with the compounds (e2) and/or (e3).

As specific examples of bisimides (a) of formula (I), particularly representative are the compounds described in French Application FR-A-2,608,613, namely:
N,N'-meta-phenylenebismaleimide;
N,N'-para-phenylenebismaleimide;
N,N'-4,4'-diphenylmethanebismaleimide;
N,N'-4,4'-diphenyl ether bismaleimide;
N,N'-4,4'-diphenyl sulfone bismaleimide;
N,N'-1,4-cyclohexylenebismaleimide;
N,N'-4,4'-(1,1-diphenylcyclohexane)bismaleimide;
N,N'-4,4'-(2,2-diphenylpropane)bismaleimide;
N,N'-4,4'-triphenylmethanebismaleimide;
N,N'-2-methyl-1,3-phenylenebismaleimide;
N,N'-4-methyl-1,3-phenylenebismaleimide;
N,N'-5-methyl-1,3-phenylenebismaleimide.

These bismaleimides can be prepared according to the processes described in U.S. Pat. No. 3,018,290 and British Patent GB-A-1,137,290. N,N'-4,4'-Diphenyl methanebismaleimide, whether alone or mixed with N,N'-2-methyl1,3-phenylenebismaleimide, N,N'-4-methyl1,3-phenylenebismaleimide and/or N,N'-5-methyl1,3-phenylenebismaleimide, is preferably employed according to the present invention.

As specific examples of hindered diamines of formulae (II) and (III), particularly representative are:
4,4'-diamino-3,3',5,5'-tetramethyldiphenylmethane;
4,4'-diamino-3,3',5,5'-tetraethyldiphenylmethane;
4,4'-diamino-3,5-dimethyl-3',5'-diethyldiphenylmethane;
4,4'-diamino-3,3'-diethyl-5,5'-dimethyldiphenylmethane;
4,4'-diamino-3,3',5,5'-tetraisopropyldiphenylmethane;

4,4'-diamino-3,3'-diisopropyl-5,5'-dimethyldiphenylmethane;
1,3-diamino-2,4-diethyl-6-methylbenzene;
1,3-diamino-2-methyl-4,6-diethylbenzene;
and mixtures thereof.

These hindered diamines can be prepared according to the processes described in British Patent GB-A-852,651 and U.S. Pat. No. 3,481,900.

4,4'-Diamino-3,3',5,5'-tetramethyldiphenylmethane, 4,4'-diamino-3,3',5,5'-tetraethyldiphenylmethane, 4,4'-diamino-3,3'-diethyl-5,5'-dimethyldiphenylmethane and mixtures thereof are the preferred diamines according to the present invention.

The amounts of N,N'-bisimide(s) (a) and of hindered diamine(s) (b) are selected such that the ratio r: number of moles of bisimide(s) (a)/number of moles of diamine(s) (b) ranges from 1.1/1 to 20/1, and preferably ranges from 2/1 to 5/1.

In certain cases it may be advantageous to modify the polymers according to the present invention by additional use of a copolymerizable reactant (c) and/or of a compound of the imidazole type (d).

As an optional reactant (c) which is suitable, particularly representative are the compounds described in French Application FR-A-2,608,613, namely:
(c1) either one or more monomers of the formula:

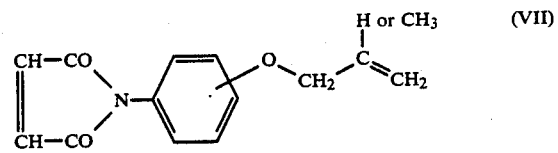

in which the allyloxy or methallyloxy radical is in an ortho, meta or para position relative to the carbon atom of the benzene ring bonded to the nitrogen atom;

(c2) or a compound comprising:
(i) a mixture of a monomer of the formula:

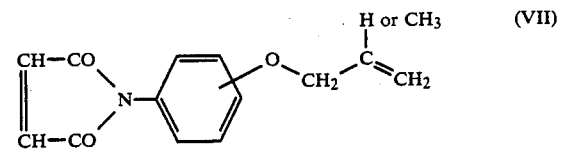

in which the allyloxy or methallyloxy radical is in an ortho, meta or para position relative to the carbon atom of the benzene ring bonded to the nitrogen atom, with:
(ii) at least one monosubstituted compound of the formula:

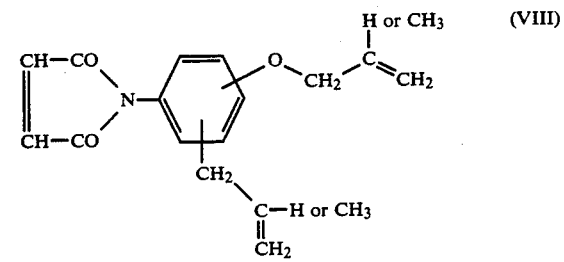

and, optionally, (iii) one or more disubstituted compounds of the formula:

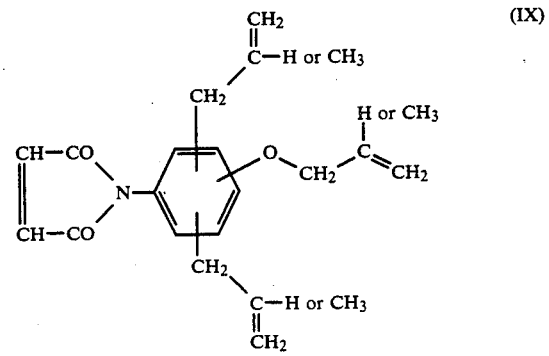

In the abovementioned compound used as reactant (c2), the proportions of the various constituents of the mixture of the compounds of formulae (VII), (VIII) and optionally (IX) may vary over wide limits. In general, the proportions of the constituents are selected within the following limits (expressing the weight percentage of each of the constituents in the mixture):

(1) at least 30%, and preferably from 50% to 80%, of N-(meth)allyloxyphenylmaleimide of formula (VII);

(3) from 5% to 50%, and preferably from 10% to 35%, of mono(meth)allyl substituted derivative(s) of formula (VIII); and (3) from 0% to 20%, and preferably from 0% to 15% of di(meth)allyl substituted derivative(s) of formula (IX), with the sum of the constituents in each case equalling 100% by weight.

The optional reactant (c) may also be one or more compounds (c3).

It will be appreciated that mixtures (c1+c3) or (c2+c3) may be employed as the reactant (c).

With regard to the optional reactant (c1), this is preferably selected from among:
N-(2-allyloxyphenyl)maleimide;
N-(3-allyloxyphenyl)maleimide;
N-(4-allyloxyphenyl)maleimide;
N-(2-methallyloxyphenyl)maleimide;
N-(3-methallyloxyphenyl)maleimide;
N-(4-methallyloxyphenyl)maleimide;
and mixtures thereof.

The maleimides of formula (VII) are known compounds which are described in European Patent Application EP-A-0,208,634.

With regard to the optional reactant (c2), the crude product obtained by the process described in European Patent Application EP-A-0,274,967 is preferably employed as a compound containing a mixture of N-(meth)allyloxyphenylmaleimide of formula (VII) with one or more (meth)allylated substituted derivative(s) of formula(e) (VIII) and optionally (IX).

With regard to the optional reactant (c3), preferred are vinylpyridines, N-vinylpyrrolidone, allyl isocyanurate and vinyltetrahydrofuran.

In respect of the amount of the optional reactant (c), this generally constitutes less than 60%, and preferably ranges from 2% to 25%, of the total weight of the reactants (a) and (b).

The optional imidazole compound (d) corresponds to the general formula set forth in French Application FR-A-2,608,613, namely:

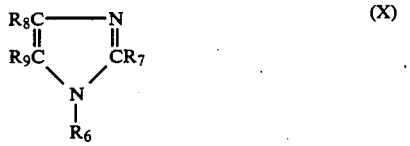

in which each of $R_6$, $R_7$, $R_8$ and $R_9$, which may be identical or different, is a hydrogen atom, an alkyl or alkoxy radical containing from 1 to 20 carbon atoms or a vinyl, phenyl or nitro radical, with the proviso that $R_8$ and $R_9$ may together form, with the carbon atoms from which they depend, a single ring such as, for example, a benzene ring, with the further proviso that $R_6$ may also be a carbonyl group bonded to a second imidazole ring.

As specific examples of imidazole compounds (d), particularly representative are imidazole or glyoxalin, 1-methylimidazole, 2-methylimidazole, 1,2-dimethylimidazole, 1-vinylimidazole, 1-vinyl-2-methylimidazole, benzimidazole and carbonyldiimidazole.

The optional imidazole compound (d) is employed in catalytic amounts. Depending on the nature of the imidazole compound and depending on the desired rate of polymerization at the processing stage, the imidazole compound is employed in a proportion ranging from 0.005% to 1% by weight relative to the total weight of the reactants (a)+(b)+optionally (c), and preferably ranging from 0.01% to 0.5%.

The polymers according to the invention can be prepared by direct heating of the bisimide(s) (a), of the amine reactant (b) and of the additive (e), optionally in the presence of the reactant (c) and/or of the imidazole compound (d), at least until a homogeneous liquid mixture is obtained. The temperature can vary as a function of the physical state of the compounds present, but it generally ranges from 50° C. to 300° C.. It is advantageous to process the starting compounds into a thoroughly mixed state and to maintain them in such state before and during the heating, for example by means of good stirring. When the reactant (c) and/or the imidazole compound (d) are employed, it is (they are) preferably added to the well-stirred reaction mixture after the mixture of (a)+(b)+(e) has been melted. When the compound (d) is particularly active, to avoid its encapsulation in the generated polymer network, it is desirable to add it in a solvent or diluent which is compatible with the reaction mixture; it was found that it could be advantageous to employ one of the polar organic liquids which are discussed hereinbelow as a solvent or diluent.

The preparation of the polymers according to the invention can also be carried out by heating the mixture of the reactants in the presence of variable amounts of an organic diluent which is liquid over at least a part of the range 50° C.–250° C. Among these diluents, particularly suitable are aromatic hydrocarbons such as xylenes and toluene, halogenated hydrocarbons such as chlorobenzenes, polar organic liquids such as dioxane, tetrahydrofuran, dibutyl ether, dimethylformamide, dimethylsulfoxide, N-methylpyrrolidone, dimethylacetamide, cyclohexanone, methyl glycol and methyl ethyl ketone. The polymer solutions or suspensions may be employed as such for a variety of purposes. The polymers can also be isolated, for example by filtration, optionally after precipitation by means of an organic diluent which is miscible with the solvent employed.

It will also be appreciated that the properties of the polymers according to the invention can vary to a large extent, particularly as a function of the precise nature of the reactants used, of the proportions of reactants which are selected and of the precise temperature conditions adopted in the range set forth above. Insofar as the polymers obtained are concerned, the latter can be cured polymers, insoluble in the usual solvents such as, for example, the polar organic liquids noted in the preceding paragraph and exhibiting no appreciable softening below the temperature at which they begin to degrade.

However, these polymers can also be in the form of prepolymers (P) which are soluble in the usual solvents such as, for example, the polar organic liquids mentioned above and exhibiting a softening point at a temperature below 200° C. (in general, this softening point ranges from 50° to 150° C.). These prepolymers may be prepared in bulk by heating the mixture of the reactants until a homogeneous or pasty product is obtained at a temperature which generally ranges from 50° C. to 180° C. for a period of time which may range from a few minutes to a few hours, this period being proportionately shorter the higher the temperature adopted. Here, too, before the mixture of the reactants is subjected to heating, it is advantageous to convert them into a thorough mixture by stirring beforehand. Again, there is a preferred embodiment in the use of the reactant (c) and/or of the optional imidazole compound (d), and it is that described above in connection with the direct preparation of the cured polymers. The preparation of the polymers can also be carried out in the presence of varying amounts of a diluent which is liquid at least over a part of the range 50°–180° C. In this context, the polar organic liquids which were discussed earlier can be advantageously employed as a diluent.

The prepolymers (P) can be employed in the form of a liquid mass, a simple casting with heating being sufficient for shaping and producing molded articles. They can also be employed, after cooling and grinding, in the form of powders, which are remarkably well adapted for compression molding operations, optionally in the presence of fillers in the form of powders, spheres, granules, fibers or flakes. In the form of suspensions or of solutions, the prepolymers (P) can be employed for producing coatings and preimpregnated intermediate articles (prepregs) whose reinforcement may include fibrous materials based on aluminum or zirconium oxide or silicate, carbon, graphite, boron, asbestos or glass. These prepolymers (P) can also be employed for the production of cellular materials after incorporation of a blowing agent such as, for example, azodicarbonamide.

In a second stage, the prepolymers (P) can be cured by heating them to temperatures on the order of 300° C., generally ranging from 150° C. to 300° C.; an additional shaping can be carried out during the curing, optionally under vacuum or under superatmospheric pressure, it being possible for these operations to be consecutive also.

In a preferred embodiment of the present invention, the operation is carried out in two stages, the first stage entailing heating the mixture of the reactants to a temperature of from 50° to 180° C. to form a prepolymer (P), the second stage comprising curing the prepolymer (P) after it has been appropriately shaped, by heating to temperatures on the order of 300° C., generally ranging from 150° C. to 300° C.

In another preferred embodiment of the present invention, the operation is also carried out in two stages, but using, in the first stage, a continuous process for preparing the prepolymer (P) comprising separately introducing into a blender with an extruder screw:

(i) on the one hand, the bisimide (a) in the divided solid state; and (ii) on the other hand, the group of reactants comprising the amine reactant (b) in the solid, liquid or molten state and the additive (e) in the liquid state, together with, if need be, the reactant (c) in the liquid state and/or the imidazole compound (d) in the solid state or in solution, with the proviso that the various reactants of this group can themselves be introduced together or separately, as such.

By the expression "blender with an extruder screw" is intended any apparatus which does not have any dead space when the material is advancing. Apparatus of this type, which can incorporate one or more screws, are described in the text by E. G. Fisher, *Extrusion of Plastics* (Interscience Publishers, 1964), pages 104 to 108. These blenders may incorporate two endless screws meshing intimately with each other and rotating in the same direction; such apparatus, equipped more particularly for preparing alkali metal terephthalates, is described in French Patent FR-A-1,462,935. Another class of blenders which can be used comprises apparatus incorporating an endless screw with interrupted flights performing a rotational motion and an oscillating motion in the direction of the axis at the same time, and housed in an enclosure incorporating teeth which interact with the interrupted fins of the screw. Such apparatus is described in French Patents FR-A-1,184,392, 1,184,393, 1,307,106 and 1,369,283.

The polymers according to the invention are particularly useful for industrial applications which require materials having good mechanical and electrical properties, together with a great chemical inertness at temperatures of 200° to 300° C. By way of examples, they are suitable for the manufacture of insulators in plate or tubular form for electrical transformers, substrates for printed circuits, and the like. The preimpregnated articles can be used for producing components of various shapes and functions in many industries such as, for example, in the electrical and electronics industries. These components, more properly designated laminates and which may be articles of revolution, are produced by placing a number of layers of prepregs over a former or a substrate. Prepregs can also be used as reinforcements or as a means of repairing damaged components.

In order to further illustrate the present invention and the advantages thereof, the following specific example is given, it being understood that same is intended only as illustrative and in nowise limitative.

EXAMPLE

The following materials were introduced at ambient temperature into a glass reactor fitted with an anchor-type stirrer:

(i) 82 g (0.239 mole) of N,N′-4,4′-diphenylmethanebismaleimide;

(ii) 18 g (0.070 mole) of 4,4′-diamino-3,3′,5,5′-tetramethyldiphenylmethane; and (iii) 8 g of a brominated epoxy resin produced by the condensation of tetrabrominated bisphenol A with epichlorohydrin; it had an elemental bromine content on the order of 50% by weight and an epoxy equivalent weight of 450. It is available commercially under the Dow Company's registered trademark Qatrex, type 6410.

The amount of bromine contributed by the epoxy resin, expressed as the weight contributed by the epoxy resin, expressed as the weight percentage of elemental bromine relative to the weight of the combination of bisimide +diamine+epoxy resin+N-vinyl-2-pyrrolidone (cf. below), was equal to 3.4%. This resin was introduced into the reactor in the form of a solution in 10 g of cyclohexanone.

The reactor was immersed in an oil bath preheated to 160° C. and the mixture was stirred until the ingredients introduced melted completely and a homogeneous mass had been obtained. This stage lasted 5 minutes. The molten mix thus obtained was cooled to 140° C. and 8 g of N-vinyl-2-pyrrolidone were introduced, and the entire mass was then permitted to react for 28 minutes with stirring.

A prepolymer exhibiting a softening point of approximately 80° C. was thus obtained. The "softening point" is the term associated with the approximate temperature at which a glass rod 6 mm in diameter can easily penetrate a few millimeters into the prepolymer. This prepolymer was soluble in solvents such as, for example, N-methyl or pyrrolidone, dimethylformamide and cyclohexanone.

A first batch of prepolymer prepared as indicated above was used to manufacture prepregs and 10-ply copper laminates (10 layers of prepregs). Thus, a solution of prepolymer at a concentration of 50% by weight in N-methylpyrrolidone was used to coat a glass fabric manufactured by the Porcher Company under reference 7628, whose weight per unit area was 200 g/m² and which had been subjected to a treatment with gamma-aminopropyltriethoxysilane (Union Carbide silane A 1100). The impregnated fabric contained 40 g of prepolymer per 60 g of fabric; it was dried for 5 minutes in a ventilated atmosphere at 160° C. 10 squares (15 × 15 cm) were then cut therefrom and were stacked with a copper sheet 35 μm in thickness, placed on one of the outer face surfaces of the stack and the assembly was placed between the platens of a press under the following conditions:

(a) pressure: $40 \times 10^5$ Pa,
(b) heating of the press platens: 1 hour at 180° C.

After a postcure of 16 hours at 200° C., the adhesion of the copper to the 10-ply laminate thus prepared was examined: this adhesion, measured with a tensometer by pulling the copper at an angle of 90° (according to MIL standard P 55,617 B utilizing a pull speed of 55 mm/min), was on the order of 19.6 N/cm. Under the same conditions, the 10-ply copper laminate manufactured from a prepolymer prepared as shown above, but in the absence of brominated epoxy resin, produced an adhesion on the order of 18.6 N/cm.

A second batch of prepolymer was used to prepare prepregs containing 45% by weight of prepolymer an laminates comprising 5 plies under the conditions described above (it should be noted that no copper sheet was employed here). After a postcure of 16 hours at 200° C., combustibility measurements were performed using the UL 94 vertical test (thickness of the laminate-based test specimens: 0.8 mm; the proportion of resin in the laminate after postcure was approximately 40% by weight; the burning time is given in seconds after conditioning for 48 hours at 23° C. and at 50% relative humidity; the classification was established on the average of 10 results: 5 test specimens and 2 tests on each specimen):

(1) burning time: 3 s;
(2) classification: VO.

The classification was found to be equal to V1 in the absence of brominated epoxy resin.

A third batch of prepolymer was used to prepare prepregs containing 40% by weight of prepolymer and laminates comprising 22 plies under the conditions described above (no copper sheet was employed here either). After a postcure of 16 hours at 200° C., measurements of the thermal expansion coefficient along the Z-axis of the laminates were performed (thickness of the laminate-based test specimens: 3 mm). These measurements were carried out by Thermomechanical Analysis (TMA), using a Du Pont model 982 apparatus, with a rate of temperature increase of 10 K/min under a nitrogen atmosphere. The value determined for this coefficient was on the order of $30 \times 10^{-6}$ m m$^{-1}$ K$^{-1}$. Under the same conditions, the laminate with 22 plies, manufactured from a prepolymer prepared in the absence of any brominated epoxy resin, had a thermal expansion coefficient along the Z-axis on the order of $40 \times 10^{-6}$ m m$^{-1}$ K$^{-1}$. Furthermore, the glass transition temperature of the cured polymer, which was determined during the measurements performed by Thermomechanical Analysis, was found to be 250° C.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. An imido polymer comprising the copolymerizate of:
   (a) at least one N,N'-bisimide having the formula:

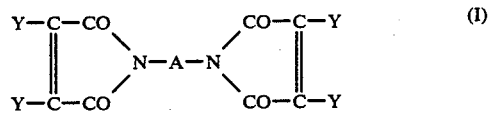

in which the symbols Y, which may be identical or different, are each H, CH₃ or Cl; the symbol A is a cyclohexylene, phenylene, 4-methyl-1,3-phenylene, 2-methyl-1,3-phenylene, 5-methyl-1,3-phenylene, or 2,5-diethyl-3-methyl-1,4-phenylene radical, or a radical of the formula:

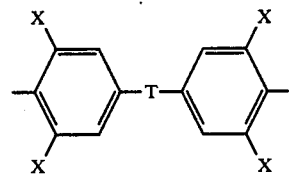

in which T is a single valence bond or one of the following atoms or groups:

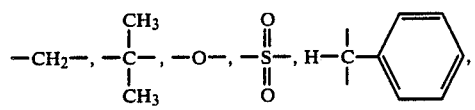

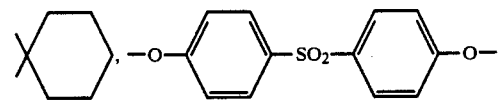

and the symbols X, which may be identical or different, are each a hydrogen atom or a methyl, ethyl or isopropyl radical;

(b) at least one hindered diprimary diamine having the following formulae (II) or (III):
   (i) a compound of the general formula:

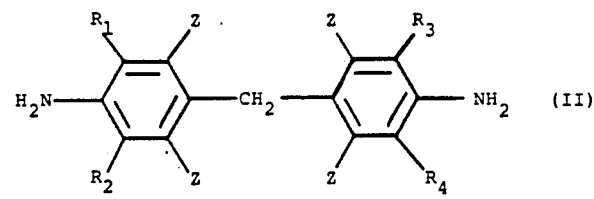

in which the symbols $R_1$, $R_2$, $R_3$ and $R_4$, which may be identical or different, are each a methyl, ethyl, propyl or isopropyl radical; and the symbols Z, which may be identical or different, are each a hydrogen atom or a chlorine atom; or (ii) a compound of the formula:

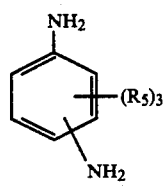

in which the amino radicals are in a meta or para position relative to each other; and the symbols $R_5$, which may be identical or different, are each a methyl, ethyl, propyl or isopropyl radical;

(c) optionally, at least one nonhalogenated monomer other than a bisimide of formula (I) and containing at least one polymerizable carbon-carbon double bond;

(d) optionally, an imidazole compound; and (e) at least one of the following compounds:
  (e1) a chlorinated or brominated epoxy resin;
  (e2) an N,N'-alkylenebistetrahalophthalimide of the formula:

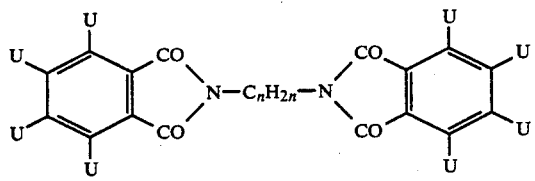

in which the symbols U, which may be identical or different, are each a chlorine or bromine atom; the alkylene radical $-C_nH_{2n}-$ may be linear or branched; and n is an integer equal to 1, 2, 3 or 4; and (e3) a halogenated compound of the formula:

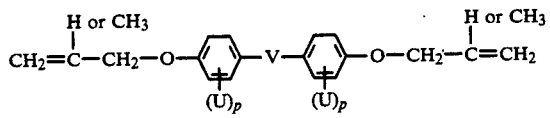

in which the symbols U are as defined above; the symbol V is a single valence bond, a linear or branched $-C_nH_{2n}-$ alkylene radical, with n being equal to 1, 2, 3 or 4, or an oxygen atom; and p is an integer equal to 2, 3 or 4.

2. The imido polymer as defined by claim 1, said at least one N,N'-bisimide (a) comprising N,N'-metaphenylenebismaleimide; N,N'-para-phenylenebismaleimide; N,N'-4,4'-diphenylmethanebismaleimide; N,N'-4,4'-diphenyl ether bismaleimide; N,N'-4,4'-diphenyl sulfone bismaleimide; N,N'-1,4-cyclohexylenebismaleimide; N,N'-4,4'-(1,1-diphenylcyclohexane)bismaleimide; N,N'-4,4'-(2,2-diphenylpropane)bismaleimide; N,N'-4,4'-triphenylmethanebismaleimide; N,N'-2-methyl-1,3-phenylenebismaleimide; N,N'-4-methyl-1,3-phenylenebismaleimide; N,N'-5-methyl-1,3-phenylenebismaleimide; or admixture thereof.

3. The imido polymer as defined by claim 1, said at least one hindered diprimary diamine (b) comprising 4,4'-diamino-3,3',5,5'-tetramethyldiphenylmethane; 4,4'-diamino-3,3',5,5'-tetraethyldiphenylmethane; 4,4'-diamino-3,5-dimethyl-3',5'-diethyldiphenylmethane; 4,4'-diamino-3,3'-diethyl-5,5'-dimethyldiphenylmethane; 4,4'-diamino-3,3',5,5'-tetraisopropyldiphenylmethane; 4,4'-diamino-3,3'-diisopropyl-5,5'-dimethyldiphenylmethane; 1,3-diamino-2,4-diethyl-6-methylbenzene; 1,3-diamino-2-methyl-4,6-diethylbenzene; or admixture thereof.

4. The imido polymer as defined in claim 1, said at least one compound (e) comprising (e1): (i) a chlorinated or brominated epoxy resin which has an epoxy equivalent weight ranging from 200 to 2,000 and which comprises a glycidyl ether produced by reacting with epichlorohydrin a polyphenol compound chlorinated or brominated on the aromatic nucleus or nuclei thereof, said polyphenol comprising a bis(hydroxyphenyl)alkane, or a product of condensation of such polyphenol with an aldehyde; or (ii) admixture of such chlorinated or brominated epoxy resin with a like but nonhalogenated such epoxy resin.

5. The imido polymer as defined by claim 1, said at least one compound (e) comprising (e2): an N,N'-alkylenebistetrabromophthalimide.

6. The imido polymer as defined by claim 1, said at least one compound (e) comprising (e3): a bis(allyloxydibromophenyl)alkane of the formula:

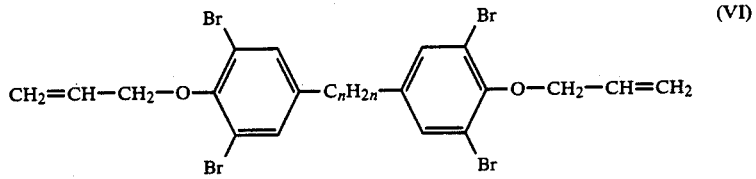

in which n is an integer equal to 1, 2 or 3.

7. The imido polymer as defined by claim 1, wherein the amounts of the at least one N,N'-bisimide (a) and the at least one hindered diamine (b) are such that the ratio r: number of moles of bisimide (a)/number of moles of diamine (b) ranges from 1.1/1 to 20/1.

8. The imido polymer as defined by claim 1, said copolymerizate comprising an amount of the comonomer (c) of less than 60% of the total weight of the monomers (a)+(b).

9. The imido polymer as defined by claim 1, said copolymerizate having been prepared in the presence of an imidazole compound (d) in an amount thereof ranging from 0.005% to 1% by weight relative to the total weight of the reactants (a)+(b)+optionally (c).

10. The imido polymer as defined by claim 1, comprising an amount of compound (e) ranging from 2% to 30% by weight of the mixture of bisimide (a)+diamine (b)+optional reactant (c), and an amount of chlorine or bromine contributed by said compound (e), expressed as the weight percentage of elemental chlorine or elemental bromine relative to the weight of the overall mixture of bisimide (a) +diamine (b)+optional reactant (c)+compound (e), of not more than 6%.

11. The imido polymer as defined by claim 1, in cured state, insoluble in typical polar organic solvents, and exhibiting no appreciable softening below the degradation temperature thereof.

12. The imido polymer as defined by claim 1, in curable prepolymeric state, soluble in typical polar organic solvents, and having a softening point at a temperature below 200° C.

13. The imido polymer as defined by claim 4, said polyphenol comprising 2,2-bis(4-hydroxyphenyl)propane, bis(4-hydroxyphenyl)methane, bis(4-hydroxyphenyl)methylphenylmethane and bis(4-hydroxyphenyl)tolylmethanes, resorcinol, hydroquinone, pyrocatechol, or 4,4'-dihydroxydiphenyl.

14. A shaped article comprising the imido polymer as defined by claim 1.

15. A shaped article comprising the imido polymer as defined by claim 11.

16. A shaped article comprising the imido polymer as defined by claim 12.

17. A composition of matter comprising:

(a) at least one N,N'-bisimide having the formula:

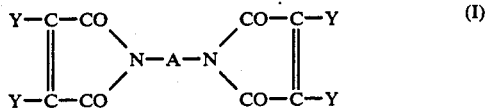

in which the symbols Y, which may be identical or different, are each H, $CH_3$ or Cl; the symbol A is a cyclohexylene, phenylene, 4-methyl-1,3-phenylene, 2-methyl1,3-phenylene, 5-methyl1,3-phenylene, or 2,5-diethyl-3-methyl1,4-phenylene radical, or a radical of the formula:

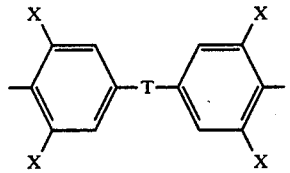

in which T is a single valence bond or one of the following atoms or groups:

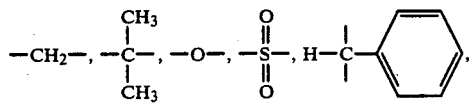

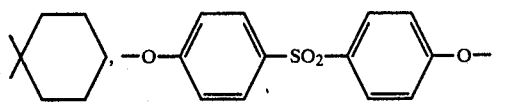

and the symbols X, which may be identical or different, are each a hydrogen atom or a methyl, ethyl or isopropyl radical;

(b) at least one hindered diprimary diamine having the following formulae (II) or (III):

(i) a compound of the general formula:

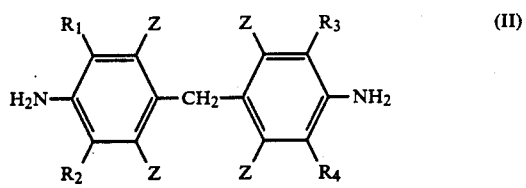

in which the symbols $R_1$, $R_2$, $R_3$ and $R_4$, which may be identical or different, are each a methyl, ethyl, propyl or isopropyl radical; and the symbols Z, which may be identical or different, are each a hydrogen atom or a chlorine atom; or (ii) a compound of the formula:

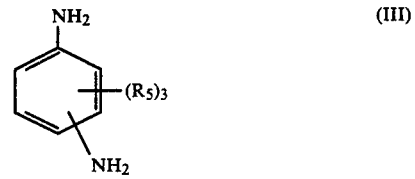

in which the amino radicals are in a meta or para position relative to each other; and the symbols $R_5$, which may be identical or different, are each a methyl, ethyl, propyl or isopropyl radical;

(c) optionally, at least one nonhalogenated monomer other than a bisimide of formula (I) and containing at least one polymerizable carbon-carbon double bond;

(d) optionally, an imidazole compound; and (e) at least one of the following compounds:

(e1) a chlorinated or brominated epoxy resin;

(e2) an N,N'-alkylenebistetrahalophthalimide of the formula:

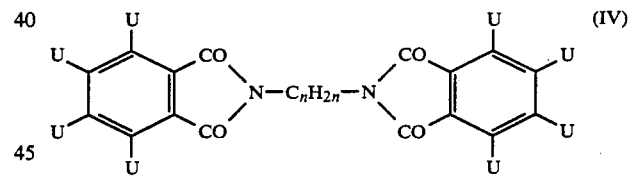

in which the symbols U, which may be identical or different, are each a chlorine or bromine atom; the alkylene radical $-C_nH_{2n}-$ may be linear or branched; and n is an integer equal to 1, 2, 3 or 4; and (e3) a halogenated compound of the formula:

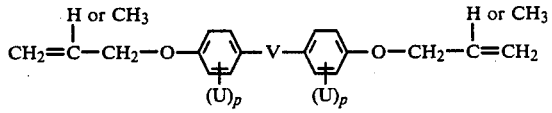

in which the symbols U are as defined above; the symbol V is a single valence bond, a linear or branched $-C_nH_{2n}-$ alkylene radical, with n being equal to 1, 2, 3 or 4, or an oxygen atom; and p is an integer equal to 2, 3 or 4.

* * * * *